United States Patent
Brown et al.

(10) Patent No.: US 9,276,529 B1
(45) Date of Patent: Mar. 1, 2016

(54) HIGH PERFORMANCE GAN OPERATIONAL AMPLIFIER WITH WIDE BANDWIDTH AND HIGH DYNAMIC RANGE

(71) Applicant: HRL Laboratories, LLC, Malibu, CA (US)

(72) Inventors: David F. Brown, Thousand Oaks, CA (US); Miroslav Micovic, Thousand Oaks, CA (US); Ara K. Kurdoghlian, La Canada, CA (US); Alexandros Margomenos, Pasadena, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/506,070

(22) Filed: Oct. 3, 2014

(51) Int. Cl.
| | | |
|---|---|---|
| *H03F 3/45* | (2006.01) | |
| *H03F 1/48* | (2006.01) | |
| *H03F 3/193* | (2006.01) | |
| *H03F 3/68* | (2006.01) | |

(52) U.S. Cl.
CPC .............. *H03F 1/483* (2013.01); *H03F 3/193* (2013.01); *H03F 3/45179* (2013.01); *H03F 3/68* (2013.01); *H03F 2003/45008* (2013.01); *H03F 2200/36* (2013.01); *H03F 2200/451* (2013.01); *H03F 2203/45051* (2013.01); *H03F 2203/45541* (2013.01)

(58) Field of Classification Search
USPC .................................. 330/260, 310, 294, 292
IPC ......................................................... H03F 3/45
See application file for complete search history.

(56) References Cited

U.S. PATENT DOCUMENTS

| 4,625,246 A | * | 11/1986 | Burgyan | ................ | G11B 20/24 360/61 |
|---|---|---|---|---|---|
| 4,849,659 A | * | 7/1989 | West | .................... | H03K 17/603 326/30 |
| 5,083,046 A | * | 1/1992 | Nagasawa | .............. | H03K 5/151 326/115 |
| 5,091,663 A | * | 2/1992 | Ishizaki | ........... | H03K 3/356034 327/52 |
| 5,546,218 A | * | 8/1996 | Komatsubara | ........ | G02F 1/0121 359/237 |
| 5,886,578 A | * | 3/1999 | Miyashita | ........... | H03F 3/45076 330/253 |
| 6,433,611 B1 | * | 8/2002 | Foroudi | ................ | H03K 5/003 327/170 |
| 7,898,333 B2 | | 3/2011 | Griffith et al. | | |
| 8,222,958 B2 | | 7/2012 | Griffith et al. | | |
| 8,354,885 B2 | | 1/2013 | Griffith et al. | | |
| 2006/0261892 A1 | * | 11/2006 | Sutardja | ................... | H03F 1/08 330/253 |

OTHER PUBLICATIONS

Z. Griffith et al., "mm-Wave Operational Amplifiers Employing Simple-Miller Compensation, with OIP3/PDC Ratios of 211 (10dB Nf) and 144 (6.0 dB NF) at 2 GHz", 2012 CSIS Symposium, Oct. 2008, pp. 1-4.

* cited by examiner

*Primary Examiner* — Patricia T Nguyen
(74) *Attorney, Agent, or Firm* — Ladas & Parry

(57) ABSTRACT

An operational amplifier includes three transconductance stages (TSs) each having a differential input and a differential output, a first and second resistor coupled between the differential output of the first TS and the differential input of the first TS, a third and fourth resistor coupled between the differential output of the third TS and the differential input of the first TS, a first and second capacitor coupled between the differential output of the third TS and the differential input of the third TS, wherein the first, second, and third TSs each include a differential input amplifier coupled to the differential input of the respective TS, a differential output amplifier coupled to the differential output of the respective TS, and a plurality of Schottky diodes coupled between the differential input amplifier and the differential output amplifier for voltage level shifting.

22 Claims, 5 Drawing Sheets

HIGH PERFORMANCE GAN OPERATIONAL AMPLIFIER WITH WIDE BANDWIDTH AND HIGH DYNAMIC RANGE

CROSS REFERENCE TO RELATED APPLICATIONS

None.

TECHNICAL FIELD

This disclosure relates to operational amplifiers and in particular to GaN-based operational amplifiers.

BACKGROUND

Operational amplifiers are key building block circuits for a very wide variety of applications. Prior art Si-CMOS based operational amplifiers have a relatively low bandwidth, and less than 1 milliWatt of power handling capability. Example commercially available Si-CMOS operational amplifiers include Texas Instrument's part no. THS4304, which has a 3 GHz bandwidth, and Linear Technologies' part no. LTC6420-20, which is a differential amplifier.

Prior art InP-HBT based operational amplifiers have excellent linearity and bandwidths, but have poor noise figures and dynamic ranges. An example InP-HBT based operational amplifier is described by Z. Griffith et al. in "mm-Wave Operational amplifiers employing simple-Miller compensation, with OIP3/Pdc ratios of 211 (10 dB NF) and 144 (6.0 dB NF) at 2 GHz", 2012 CSIC Symposium, pp. 1-4, 2008.

Prior art circuits for operational amplifiers include those that are described in U.S. Pat. No. 7,898,333, issued Mar. 2, 2011 to Griffith et al., U.S. Pat. No. 8,222,958, issued Jul. 17, 2012 to Griffith et al., and U.S. Pat. No. 8,354,885, issued Jan. 15, 2013 to Griffith et al., which are incorporated by reference as though set forth in full.

What is needed is an improved operational amplifier with ultra-high linearity, high gain, wide bandwidth, low noise figure, and high power-handling capability. The embodiments of the present disclosure address these and other needs.

SUMMARY

In a first embodiment disclosed herein, an operational amplifier comprises a first transconductance stage having a first differential input and a first differential output, the first differential input having a positive and negative input, and the first differential output having a positive and negative output, a second transconductance stage having a second differential input and a second differential output, the second differential input having a positive and negative input, and the second differential output having a positive and negative output, and a third transconductance stage having a third differential input and a third differential output, the third differential input having a positive and negative input, and the third differential output having a positive and negative output, wherein the positive and negative output of the first differential output are coupled to the positive and negative input, respectively, of the second differential input, and wherein the positive and negative output of the second differential output are coupled to the positive and negative input, respectively, of the third differential input, a first resistor coupled between the negative output of the first differential output and the positive input of the first differential input, a second resistor coupled between the positive output of the first differential output and the negative input of the first differential input, a third resistor coupled between the negative output of the third differential output and the positive input of the first differential input, a fourth resistor coupled between the positive output of the third differential output and the negative input of the first differential input, a first capacitor coupled between the positive output of the third differential output and the negative input of the third differential input, and a second capacitor coupled between the negative output of the third differential output and the positive input of the third differential input, wherein the first, second, and third transconductance stages each comprise: a differential input amplifier coupled to the differential input of the respective transconductance stage, a differential output amplifier coupled to the differential output of the respective transconductance stage; and a plurality of Schottky diodes coupled between the differential input amplifier and the differential output amplifier for shifting a voltage level of the differential input amplifier.

In another embodiment disclosed herein, a method of providing an operational amplifier comprises providing a first transconductance stage having a first differential input and a first differential output, the first differential input having a positive and negative input, and the first differential output having a positive and negative output, providing a second transconductance stage having a second differential input and a second differential output, the second differential input having a positive and negative input, and the second differential output having a positive and negative output, and providing a third transconductance stage having a third differential input and a third differential output, the third differential input having a positive and negative input, and the third differential output having a positive and negative output, wherein the positive and negative output of the first differential output are coupled to the positive and negative input, respectively, of the second differential input, and wherein the positive and negative output of the second differential output are coupled to the positive and negative input, respectively, of the third differential input, providing a first resistor coupled between the negative output of the first differential output and the positive input of the first differential input, providing a second resistor coupled between the positive output of the first differential output and the negative input of the first differential input, providing a third resistor coupled between the negative output of the third differential output and the positive input of the first differential input, providing a fourth resistor coupled between the positive output of the third differential output and the negative input of the first differential input, providing a first capacitor coupled between the positive output of the third differential output and the negative input of the third differential input, and providing a second capacitor coupled between the negative output of the third differential output and the positive input of the third differential input, wherein the first, second, and third transconductance stages each comprise a differential input amplifier coupled to the differential input of the respective transconductance stage, a differential output amplifier coupled to the differential output of the respective transconductance stage, and a plurality of Schottky diodes coupled between the differential input amplifier and the differential output amplifier for shifting a voltage level of the differential input amplifier.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In the present disclosure a GaN-based operational amplifier design with ultra-high linearity, high gain, wide bandwidth, low noise figure, and high power-handling capability is described. The operational amplifier uses monolithically-integrated Schottky diodes to achieve improved performance. The high dynamic range GaN operational amplifier of the present disclosure can be used in a wide variety of analog and mixed-signal circuits, including high speed analog to digital converters (ADCs), integrators, sample-and-hold circuits, circuits for non-Foster antennas, RF-IF active baluns, pulse-shaping circuits, and active circulators.

The operational amplifiers of the present disclosure are implemented with GaN monolithic microwave integrated circuit (MMIC) technology. The GaN MMIC technology that is used has been demonstrated to achieve fT and fMAX values of greater than 250 GHz and greater than 300 GHz, respectively, while maintaining a Johnson Figure of Merit (JFoM), which is the fT times the breakdown voltage (BV), of greater than 5 THz-V. The breakdown voltage for the GaN technology is greater than 10 volts. The GaN technology has excellent bandwidth, gain, and noise figure performance, while providing high linearity, RF survivability, and dynamic range.

Figure 1A:
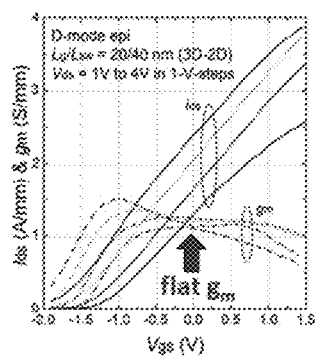
FIGS. 1A, 1B and 1C show graphs of the direct current (DC) and $g_m$ vs. $V_{gs}$, small-signal radio frequency (RF) gain vs. frequency, and noise figure performance vs. frequency, respectively, of a GaN device in accordance with the present disclosure.
Figure 1B:
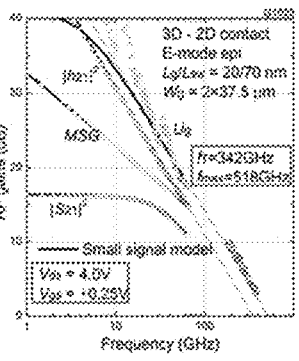
Figure 1C:
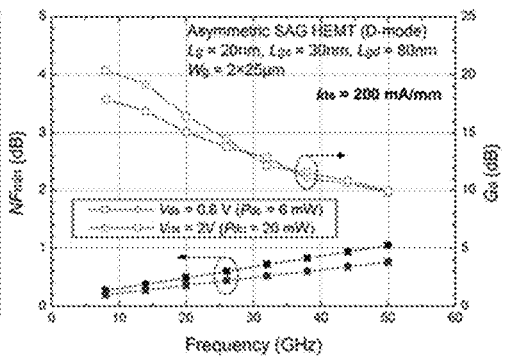

FIGS. 1A, 1B and 1C show graphs of the direct current (DC) and $g_m$ vs. $V_{gs}$, small-signal radio frequency (RF) gain vs. frequency, and noise figure performance vs. frequency, respectively, of a GaN device in accordance with the present disclosure. The gain and minimum noise figure (NFmin—0.8 dB at 50 GHz) are comparable to that achievable with 50-nm InP High Electron Mobility Transistor (HENT) technologies. A HENT is a heterostructure field-effect transistor (FET). However, in comparison to InP technology, GaN technology of the present disclosure has greater than 5 times higher breakdown voltage, better linearity, greater than 20 dB better dynamic range, and greater than 25 times higher RF input power threshold limit. The GaN devices are able to maintain excellent low noise performance at ultra-low DC power consumption. For a Vds voltage of 0.6V and DC power of 6 mW, a noise figure NFmin of 1.1 dB at 50 GHz has been measured on a 2×25 µm device.

The GaN devices have a highly-scaled gate-source spacing, which results in improved electron injection and very flat transconductance (gm) curves over a very wide range of direct current (DC) bias conditions, as shown in FIG. 1A, a feature that InP HEMTs and conventional un-scaled GaN HEMTs do not provide. Third-order distortion has been shown to be inversely proportional to the second derivative of the transconductance gm versus gate voltage. Specifically, third order output intercept point (OIP3) equals $gm^3 Rds/gm''$, where Rds is the output resistance and gm'' is the second derivative of gm. Previous work on GaAs metal-semiconductor field effect transistor (MESFET) based low noise amplifiers (LNAs) has shown that engineering the transconductance behavior of a device can improve amplifier linearity without increasing the DC power consumption. Since gm is flat for a large range of Vgs (−1.0 to +1.0V), high linearity can be maintained for a large input voltage swing.

FIG. 1B shows the small-signal radio frequency (RF) gain vs. frequency performance for a device in accordance with the present disclosure with a $f_T$ of 342 GHz and an fmax of 518 GHz. The graph of FIG. 1C shows that the GaN technology has a very low noise figure from about 7 GHz to 50 GHz.

Figure 2A:
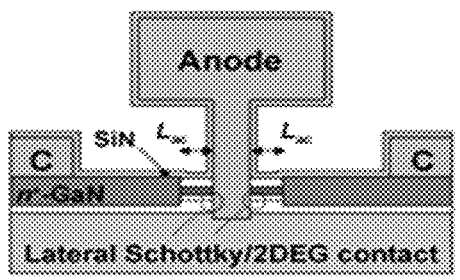
FIGS. 2A and 2B show a cross section schematic and an image, respectively, of a monolithically integrated lateral Schottky diode.
Figure 2C:
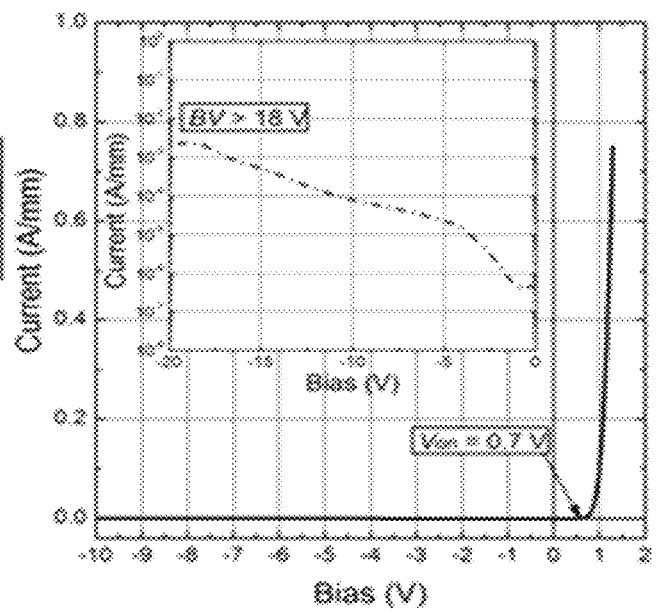
FIG. 2C shows the corresponding current-voltage (IV) characteristic for the monolithically integrated lateral Schottky diode in accordance with the present disclosure.
Figure 2B:
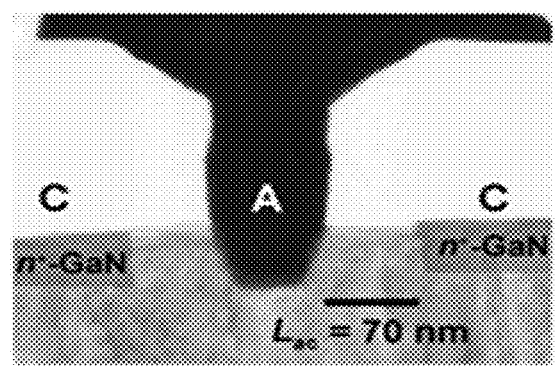

The GaN MMIC technology used in the present disclosure allows for monolithically-integrated lateral GaN Schottky diodes. FIGS. 2A and 2B show a cross section schematic and an image, respectively, of a monolithically integrated lateral Schottky diode, and FIG. 2C shows the corresponding current-voltage (IV) characteristic for the monolithically integrated lateral Schottky diode in accordance with the present disclosure. FIG. 2C also shows that the breakdown voltage of the Schottky diode is greater than 18 volts. The GaN Schottky diodes have a turn-on voltage of about 0.7 volts, as shown in FIG. 2C. The ideality factor may be 1.7, and the series resistance may be 0.5 ohm-mm. GaN Schottky diodes are utilized in the operational amplifier circuit, which is further described below, as voltage level shifters. Since these GaN Schottky diodes make a lateral contact directly to a two dimensional electron gas (2DEG), they are capable of handling much higher current density than conventional vertical FET-based Schottky diodes, which is critical for designing a compact circuit.

Figures 3A, 3B, 3C:
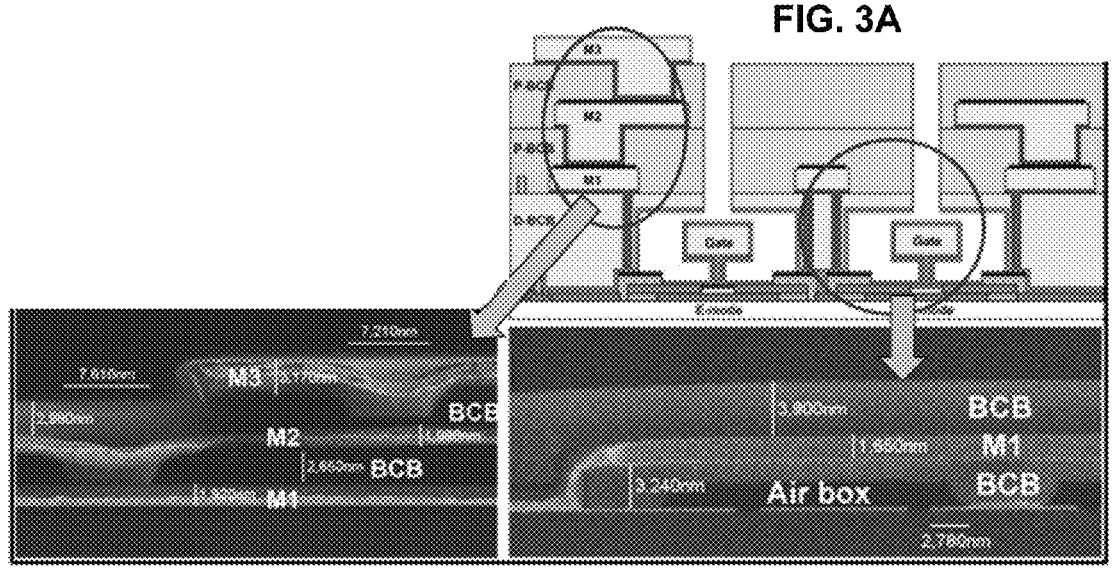
FIG. 3A shows a circuit using a three level metal layer interconnect and a single level interconnect.
FIG. 3B shows a cross section scanning electron microscope (SEM) image of a 3-level metal layer/benzocyclobutene (BCB) interconnect technology.
FIG. 3C shows a single level interconnect technology using an air box surrounding a device in accordance with the present disclosure.

The GaN device MMIC process used for the operational amplifier may use a three-level BCB interconnect technology M1, M2, and M3, as shown in FIGS. 3A and 3B. Such a three-level interconnect is critical for making the operational amplifier more compact. A more compact circuit minimizes circuit latencies and parasitic capacitances, and results in improved performance for linear feedback loops in the operational amplifier and improved circuit stability. The three-level BCB interconnect technology also enables three dimensional (3D) MMIC topologies which can further reduce circuit size. Parasitic capacitance in a transistor can be further reduced by first encapsulating the transistor with a sacrificial dielectric and then selectively removing the sacrificial dielectric to leave behind an "air box", as shown in FIG. 3C.

Figure 4B:
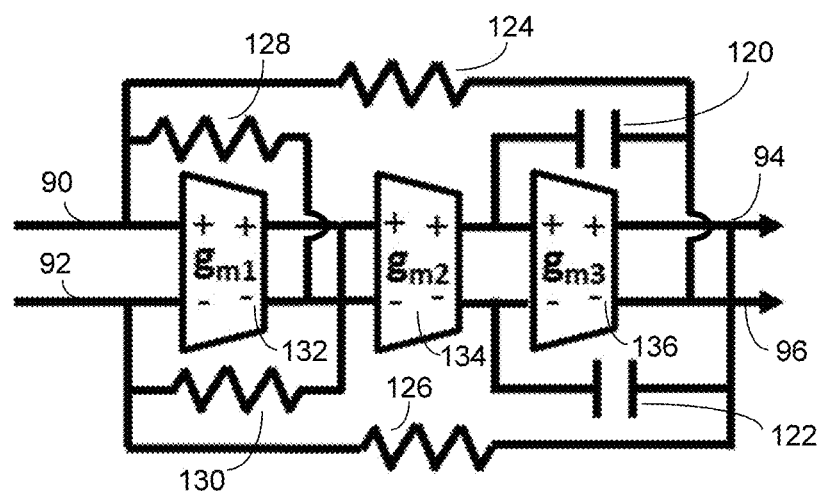
FIG. 4B shows an operational amplifier circuit utilizing three transconductance stages, each stage using the two stage amplifier of FIG. 4A in accordance with the present disclosure.
Figure 4A:
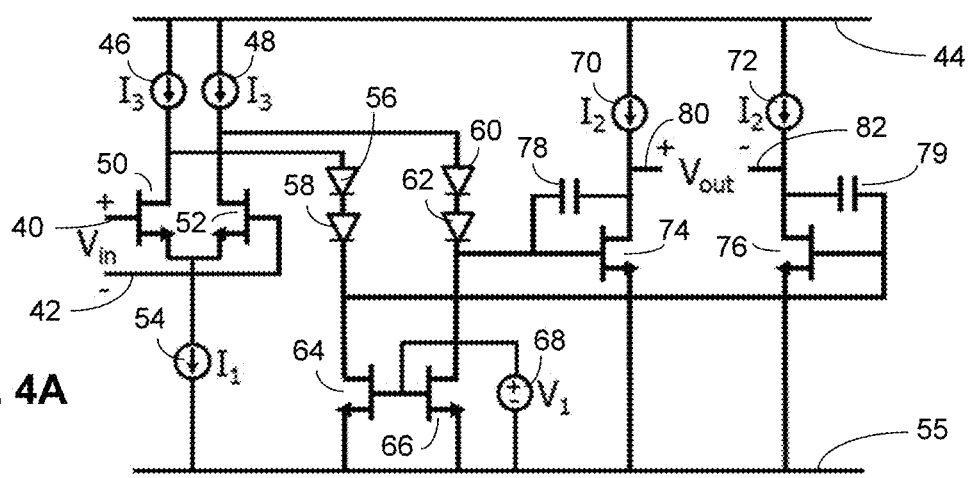
FIG. 4A shows a circuit diagram of a two stage amplifier with a differential input amplifier and a differential output amplifier.

FIG. 4A shows a two-stage GaN High Electron Mobility Transistor (HEMT) amplifier circuit with a differential input stage and a differential output stage with Schottky diodes in between the input and output stage for voltage level shifting in accordance with the present disclosure.

The differential inputs 40 and 42 are connected to the gates of field effect transistors (FETs) 50 and 52, respectively. The sources of FETs 50 and 52 are connected to current sources 46 and 48, respectively, which are connected to voltage source 44. The drains of FETs 50 and 52 are each connected to current source 54, which is connected to ground 55. The voltage of the source of FET 50 is level shifted by serially connected Schottky diodes 56 and 58. The source of FET 50 is connected to the anode of Schottky diode 56. The cathode of Schottky diode 56 is connected to the anode of Schottky diode 58. The cathode or output of Schottky diode 58 is connected to a source of FET 64. The gate of FET 64 is connected to bias voltage source 68, and the drain of FET 64 is connected to ground 55. Similarly, the voltage of the source of FET 52 is level shifted by serially connected Schottky diodes 60 and 62. The source of FET 52 is connected to the anode of Schottky diode 60. The cathode of Schottky diode 60 is connected to the anode of Schottky diode 62. The cathode or output of Schottky diode 62 is connected to a source of FET 66. The gate of FET 66 is also connected to bias voltage source 68, and the drain of FET 66 is connected to ground 55.

The differential output stage has two FETs 74 and 76. The sources of FETs 74 and 76, provide the differential outputs 80 and 82, respectively, of the two-stage GaN HEMT amplifier circuit of FIG. 4A. The sources of FETs 74 and 76 are connected to current sources 70 and 72, respectively, which are connected to voltage source 44. The drains of FETs 74 and 76 are each connected to ground 55. The gate of FET 74 is connected to the cathode or output of Schottky diode 62, and the gate of FET 76 is connected to the cathode or output of Schottky diode 58. A capacitor 78 is connected between the source and gate of FET 74, and capacitor 79 is connected between the source and gate of FET 76.

The differential voltage level-shifting Schottky diode network including Schottky diodes 56, 58, 60 and 62 between the input and output stages allows both the input stage and the output stage to utilize depletion mode (D-mode) active devices. Therefore FETs 50, 52, 74 and 76 may all be depletion mode FETs.

FIG. 4B shows an operational amplifier circuit in accordance with the present disclosure. As shown in FIG. 4B, the operational amplifier has three transconductance stages 132, 134 and 136. The two-stage GaN HEMT amplifier circuit with a differential input stage and a differential output stage shown in FIG. 4A is used for each transconductance stage of the operational amplifier shown in FIG. 4B. Therefore, each transconductance stage has the same repeated circuitry of FIG. 4A. For example, transconductance stage 132 has a differential input 40 and 42 and a differential output 80 and 82, and transconductance stages 134 and 136 also each have a differential input 40 and 42 and a differential output 80 and 82.

The operational amplifier of FIG. 4B has differential inputs 90 and 92, which are connected to differential inputs 40 and 42, respectively, of transconductance stage 132. The differential outputs 80 and 82 of transconductance stage 132 are connected to differential inputs 40 and 42 of transconductance stage 134, and the differential outputs 80 and 82 of transconductance stage 134 are connected to differential inputs 40 and 42 of transconductance stage 136. The differential outputs 80 and 82 of transconductance stage 136 are differential outputs 94 and 96, respectively, of the operational amplifier.

Resistor 126 is connected between differential output 94 and differential input 92, and resistor 124 is connected between differential output 96 and differential input 90 to linearize the differential performance of the operational amplifier. Similarly, resistor 128 is connected between differential output 82 of transconductance amplifier 132 and differential input 90, and resistor 130 is connected between differential output 80 of transconductance amplifier 132 and differential input 92.

Capacitor 120 is connected between differential output 96 and differential input 40 of transconductance amplifier 136, and capacitor 122 is connected between differential output 94 and differential input 42 of transconductance amplifier 136.

The high breakdown voltage and flat transconductance profile of the GaN FETs devices technology provide excellent operational amplifier performance. In addition the high current density of the GaN monolithically-integrated Schottky diodes improve the dynamic range of the operational amplifier compared to prior art wideband operational amplifiers.

The operational amplifier of the present disclosure may have a bandwidth from DC to greater than 6 GHz. The voltage gain of the operational amplifier may be greater than 20 dB. The noise figure of the operational amplifier may be 6 dB at 4 GHz. The third order output intercept point (OIP3) of the operational amplifier may be greater than 54 dBm, and the operational amplifier may have a linearity figure of merit greater than 100. The DC power consumption of the operational amplifier may be only 1.2 W.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. An operational amplifier comprising:
 a first transconductance stage having a first differential input and a first differential output, the first differential input having a positive and negative input, and the first differential output having a positive and negative output;

a second transconductance stage having a second differential input and a second differential output, the second differential input having a positive and negative input, and the second differential output having a positive and negative output; and
a third transconductance stage having a third differential input and a third differential output, the third differential input having a positive and negative input, and the third differential output having a positive and negative output;
wherein the positive and negative output of the first differential output are coupled to the positive and negative input, respectively, of the second differential input; and
wherein the positive and negative output of the second differential output are coupled to the positive and negative input, respectively, of the third differential input;
a first resistor coupled between the negative output of the first differential output and the positive input of the first differential input;
a second resistor coupled between the positive output of the first differential output and the negative input of the first differential input;
a third resistor coupled between the negative output of the third differential output and the positive input of the first differential input;
a fourth resistor coupled between the positive output of the third differential output and the negative input of the first differential input;
a first capacitor coupled between the positive output of the third differential output and the negative input of the third differential input; and
a second capacitor coupled between the negative output of the third differential output and the positive input of the third differential input;
wherein the first, second, and third transconductance stages each comprise:
a differential input amplifier coupled to the differential input of the respective transconductance stage;
a differential output amplifier coupled to the differential output of the respective transconductance stage; and
a plurality of Schottky diodes coupled between the differential input amplifier and the differential output amplifier for shifting a voltage level of the differential input amplifier.

2. The operational amplifier of claim 1 wherein:
the differential input amplifier of the first, second, and third transconductance stages comprises depletion mode field effect transistors; and
the differential output amplifier of the first, second, and third transconductance stages comprises depletion mode field effect transistors.

3. The operational amplifier of claim 1 wherein:
the differential input amplifier of the first, second, and third transconductance stages comprises GaN HEMT field effect transistors;
the differential output amplifier of the first, second, and third transconductance stages comprises GaN HEMT field effect transistors; and
the Schottky diodes comprise GaN Schottky diodes.

4. The operational amplifier of claim 3 wherein:
the GaN HEMT field effect transistors have an fT greater than 250 GHz, an fmax greater than 300 GHz, and a breakdown voltage (BV) greater than 10 V.

5. The operational amplifier of claim 3 wherein:
the GaN Schottky diodes have an on-resistance less than 1.0 ohm-mm, a blocking voltage greater than 10 V, and a current-handling capability greater than 0.5 mA/um.

6. The operational amplifier of claim 1 wherein:
a frequency bandwidth of the operational amplifier is greater than 6 Ghz;
a voltage gain of the operational amplifier is greater than 20 dB; and
a linearity figure of merit (LFoM) of the operational amplifier is greater than 100.

7. The operational amplifier of claim 1 wherein:
a noise figure of the operational amplifier is 6 dB at 4 GHz.

8. The operational amplifier of claim 1 wherein:
the Schottky diodes comprise monolithically integrated lateral GaN Schottky diodes.

9. The operational amplifier of claim 1 wherein each respective differential input amplifier comprises:
a first field effect transistor having a gate coupled to the positive input of the respective differential input, a source connected to a first current source, and a drain coupled to a second current source, the second current source coupled to a ground; and
a second field effect transistor having a gate coupled to the negative input of the respective differential input a source connected to a third current source, and a drain coupled to the second current source.

10. The operational amplifier of claim 9 wherein each respective plurality of Schottky diodes coupled between a respective differential input amplifier and a respective differential output amplifier for shifting a voltage level of the differential input amplifier comprises:
a first Schottky diode coupled to the source of the first field effect transistor; and
a second Schottky diode coupled to the first Schottky diode and to a source of a third field effect transistor;
wherein a gate of the third field effect transistor is coupled to a bias voltage and wherein a drain of the third field effect transistor is coupled to the ground;
a third Schottky diode coupled to the source of the second field effect transistor; and
a fourth Schottky diode coupled to the third Schottky diode and to a source of a fourth field effect transistor;
wherein a gate of the fourth field effect transistor is coupled to the bias voltage and wherein a drain of the fourth field effect transistor is coupled to the ground.

11. The operational amplifier of claim 10 wherein each respective differential output amplifier comprises:
a fifth field effect transistor having a gate coupled to the second Schottky diode, a source connected to a fourth current source, and a drain coupled to the ground;
a sixth field effect transistor having a gate coupled to the fourth Schottky diode, a source connected to a fifth current source, and a drain coupled to the ground;
a first capacitor coupled between the gate and the source of the fifth field effect transistor; and
a second capacitor coupled between the gate and the source of the sixth field effect transistor;
wherein the source of the fifth field effect transistor is coupled to the negative output of the respective differential output amplifier; and
wherein the source of the sixth field effect transistor is coupled to the positive output of the respective differential output amplifier.

12. A method of providing an operational amplifier comprising:
providing a first transconductance stage having a first differential input and a first differential output, the first differential input having a positive and negative input, and the first differential output having a positive and negative output;

providing a second transconductance stage having a second differential input and a second differential output, the second differential input having a positive and negative input, and the second differential output having a positive and negative output; and providing a third transconductance stage having a third differential input and a third differential output, the third differential input having a positive and negative input, and the third differential output having a positive and negative output;

wherein the positive and negative output of the first differential output are coupled to the positive and negative input, respectively, of the second differential input; and wherein the positive and negative output of the second differential output are coupled to the positive and negative input, respectively, of the third differential input;

providing a first resistor coupled between the negative output of the first differential output and the positive input of the first differential input;

providing a second resistor coupled between the positive output of the first differential output and the negative input of the first differential input;

providing a third resistor coupled between the negative output of the third differential output and the positive input of the first differential input;

providing a fourth resistor coupled between the positive output of the third differential output and the negative input of the first differential input;

providing a first capacitor coupled between the positive output of the third differential output and the negative input of the third differential input; and providing a second capacitor coupled between the negative output of the third differential output and the positive input of the third differential input;

wherein the first, second, and third transconductance stages each comprise:

a differential input amplifier coupled to the differential input of the respective transconductance stage;

a differential output amplifier coupled to the differential output of the respective transconductance stage; and a plurality of Schottky diodes coupled between the differential input amplifier and the differential output amplifier for shifting a voltage level of the differential input amplifier.

13. The method of claim 12 wherein:
the differential input amplifier of the first, second, and third transconductance stages comprises depletion mode field effect transistors; and
the differential output amplifier of the first, second, and third transconductance stages comprises depletion mode field effect transistors.

14. The method of claim 12 wherein:
the differential input amplifier of the first, second, and third transconductance stages comprises GaN HEMT field effect transistors;
the differential output amplifier of the first, second, and third transconductance stages comprises GaN HEMT field effect transistors; and
the Schottky diodes comprise GaN Schottky diodes.

15. The method of claim 14 wherein:
the GaN HEMT field effect transistors have an fT greater than 250 GHz, an fmax greater than 300 GHz, and a breakdown voltage (BV) greater than 10 V.

16. The method of claim 14 wherein:
the GaN Schottky diodes have an on-resistance less than 1.0 ohm-mm, a blocking voltage greater than 10 V, and a current-handling capability greater than 0.5 mA/um.

17. The method of claim 12 wherein:
a frequency bandwidth of the operational amplifier is greater than 6 Ghz;
a voltage gain of the operational amplifier is greater than 20 dB; and
a linearity figure of merit (LFoM) of the operational amplifier is greater than 100.

18. The method of claim 12 wherein:
a noise figure of the operational amplifier is 6 dB at 4 GHz.

19. The method of claim 12 wherein each respective differential input amplifier comprises:
a first field effect transistor having a gate coupled to the positive input of the respective differential input, a source connected to a first current source, and a drain coupled to a second current source, the second current source coupled to a ground; and
a second field effect transistor having a gate coupled to the negative input of the respective differential input a source connected to a third current source, and a drain coupled to the second current source.

20. The method of claim 19 wherein each respective plurality of Schottky diodes coupled between a respective differential input amplifier and a respective differential output amplifier for shifting a voltage level of the differential input amplifier comprises:
a first Schottky diode coupled to the source of the first field effect transistor; and
a second Schottky diode coupled to the first Schottky diode and to a source of a third field effect transistor;
wherein a gate of the third field effect transistor is coupled to a bias voltage and wherein a drain of the third field effect transistor is coupled to the ground;
a third Schottky diode coupled to the source of the second field effect transistor; and
a fourth Schottky diode coupled to the third Schottky diode and to a source of a fourth field effect transistor;
wherein a gate of the fourth field effect transistor is coupled to the bias voltage and wherein a drain of the fourth field effect transistor is coupled to the ground.

21. The method of claim 20 wherein each respective differential output amplifier comprises:
a fifth field effect transistor having a gate coupled to the second Schottky diode, a source connected to a fourth current source, and a drain coupled to the ground;
a sixth field effect transistor having a gate coupled to the fourth Schottky diode, a source connected to a fifth current source, and a drain coupled to the ground;
a first capacitor coupled between the gate and the source of the fifth field effect transistor; and
a second capacitor coupled between the gate and the source of the sixth field effect transistor;
wherein the source of the fifth field effect transistor is coupled to the negative output of the respective differential output amplifier; and
wherein the source of the sixth field effect transistor is coupled to the positive output of the respective differential output amplifier.

22. The method of claim 12 wherein:
the Schottky diodes comprise monolithically integrated lateral GaN Schottky diodes.

\* \* \* \* \*